United States Patent [19]

Nanda et al.

[11] Patent Number: 6,140,211
[45] Date of Patent: Oct. 31, 2000

[54] METHOD FOR RECYCLING WAFERS USED FOR QUALITY ASSURANCE TESTING OF INTEGRATED CIRCUIT FABRICATION EQUIPMENT

[75] Inventors: Arun K. Nanda; Jose O. Rodriguez, both of Orlando, Fla.

[73] Assignee: Lucent Technologies Inc., Murray Hill, N.J.

[21] Appl. No.: 09/122,276

[22] Filed: Jul. 24, 1998

[51] Int. Cl.$^7$ .................................................. H01L 21/301
[52] U.S. Cl. ........................ 438/465; 438/500; 438/691; 437/225
[58] Field of Search .................................. 438/465, 500, 438/691; 437/225

[56] References Cited

U.S. PATENT DOCUMENTS

| | | | |
|---|---|---|---|
| 4,974,367 | 12/1990 | Sawluk | 51/5 D |
| 5,329,733 | 7/1994 | Steere, Jr. | 51/165.76 |
| 5,389,579 | 2/1995 | Wells | 437/225 |
| 5,622,875 | 4/1997 | Lawrence | 438/691 |

*Primary Examiner*—Amir Zarabian
*Assistant Examiner*—Pho Luy
*Attorney, Agent, or Firm*—Jean-Marc Zimmerman

[57] ABSTRACT

A method for recycling a used silicon wafer on which ICs have been formed by IC fabrication equipment comprised of first grinding the wafer using a coarse grinding apparatus and then grinding the wafer suing a fine grinding apparatus. The coarse grinding apparatus and the fine grinding apparatus are identical to one another except for the nature of the respective grinding they perform. Deionized water is used during both grinding processes to reduce friction and to control dust. The used wafer is first mounted on a chuck of the coarse grinding apparatus that rotates at a first predetermined speed. A diamond wheel mounted on a grinding wheel holder of the coarse grinding apparatus rotates at a second predetermined speed that is faster than the first speed. The rotating wheel and the rotating wafer are brought into contact with one another and the wafer is ground until a predetermined amount of semiconductor material is removed from the face of the wafer. The wafer is then placed in the fine grinding apparatus and subjected to an identical grinding process. The loss of wafer thickness from both the coarse and fine grinding processes is no more than 50 microns. The resulting wafer is suitable for reuse in IC fabrication processes and has performance characteristics comparable with those of virgin wafers. The recycling process of the present invention typically takes only about 30–40 seconds.

24 Claims, 2 Drawing Sheets

METHOD FOR RECYCLING WAFERS USED FOR QUALITY ASSURANCE TESTING OF INTEGRATED CIRCUIT FABRICATION EQUIPMENT

FIELD OF THE INVENTION

The present invention relates to the field of integrated circuit (IC) fabrication, and more particularly to a method for recycling silicon wafers used for quality assurance testing of IC fabrication equipment.

BACKGROUND OF THE INVENTION

ICs are widely used today in many different applications such as computers, cellular telephones and consumer electronics. ICs are typically fabricated from disc-shaped wafers of silicon on which large numbers of ICs are formed. One common method of IC fabrication is to deposit various layers of semiconductor material on the face of a wafer to form the ICs. The wafers are then cut so that the individual ICs can be separated and used for different applications.

"Dummy" or "control monitor" wafers are used to check the reliability of IC fabrication equipment by testing the quality of the ICs fabricated on the wafers by the equipment. For example, dummy wafers are used to test new IC fabrication equipment prior to its use in the actual production of ICs. A dummy wafer is cycled through the equipment and the ICs formed on the dummy wafer are then examined to determine if they meet certain specified criteria indicating that the fabrication process was properly performed. Only then can the equipment be used for the actual production of ICs. Thereafter, the dummy wafers are typically discarded.

Once fabrication equipment is in actual use producing ICs, it must be periodically inspected by examining the fabricated ICs to ensure that it is functioning properly. Such quality assurance testing is typically performed on a daily basis, sometimes as often as every working shift. In addition, such testing is also performed during regularly scheduled maintenance of the fabrication equipment. During such testing, silicon wafers are used as process monitors in which a trial process, such as film deposition, is performed on the wafer by the fabrication equipment. Prescribed measurements are then performed on the wafer to determine whether the fabricated ICs meet specified tolerances. Once these tests are completed the wafer is typically discarded.

Quality assurance testing of the type described requires the use of large numbers of silicon wafers. In fact, properly testing a single piece of fabrication equipment typically requires that thousands of control monitor wafers be used. This increases the total cost of IC fabrication because the wafers are relatively expensive and typically have no other use in the fabrication process. In order to defray some of the cost of these discarded wafers, they are sometimes recycled. Conventional recycling of wafers typically involves subjecting the wafer to several chemical cleaning steps to remove the deposited layers of semiconductor material. The chemical cleaning is then followed by a final chemical/mechanical polish. Once the recycling is complete, the wafers can be reused as dummy or control monitor wafers for non-critical operations, but they are not usually suitable for actual IC production.

Conventional recycling of wafers has a number of drawbacks. The chemical cleaning steps are relatively slow, thus adding to the overall cost of recycling. Also, the chemicals are expensive and constitute a significant portion of the recycling cost. In addition, the use of these chemicals creates potentially hazardous environmental handling and disposal issues that further increase the cost of recycling.

It is therefore an object of the invention to provide a method for reducing the overall cost of IC manufacturing. It is another object of the invention to provide a way to reduce the overall cost of recycling dummy and control monitor wafers used in the quality assurance testing of IC fabrication equipment. Another object of the invention is to provide a method for reducing the time it takes to recycle these wafers. It is a further object of the invention to provide a method for recycling such wafers that eliminates the use of potentially hazardous chemicals in the cleaning process.

SUMMARY OF THE INVENTION

A method for recycling silicon wafers used for testing the quality of ICs formed by IC fabrication equipment. The silicon wafers which had semiconductor material deposited on their face are first mounted on a coarse grinding apparatus employing a first diamond wheel to remove the deposited material, and are then mounted on a fine grinding apparatus employing a second diamond wheel to fine polish the wafer. Deionized water is simultaneously applied during the steps of coarse grinding and fine grinding to reduce friction and control dust. The wafers can then be reused for quality assurance testing of IC fabrication equipment.

DETAILED DESCRIPTION OF THE DRAWINGS

The following detailed description relates to a preferred embodiment of a method for recycling silicon wafers used in the quality assurance testing of IC fabrication equipment. Although the invention is described herein as used to recycle silicon wafers onto which semiconductor material has been deposited to fabricate ICs, other kinds of applications with other kinds of substrates may benefit from use of the inventive methods and structures described herein and are considered to be within the teachings of the present invention.

Figure 1:
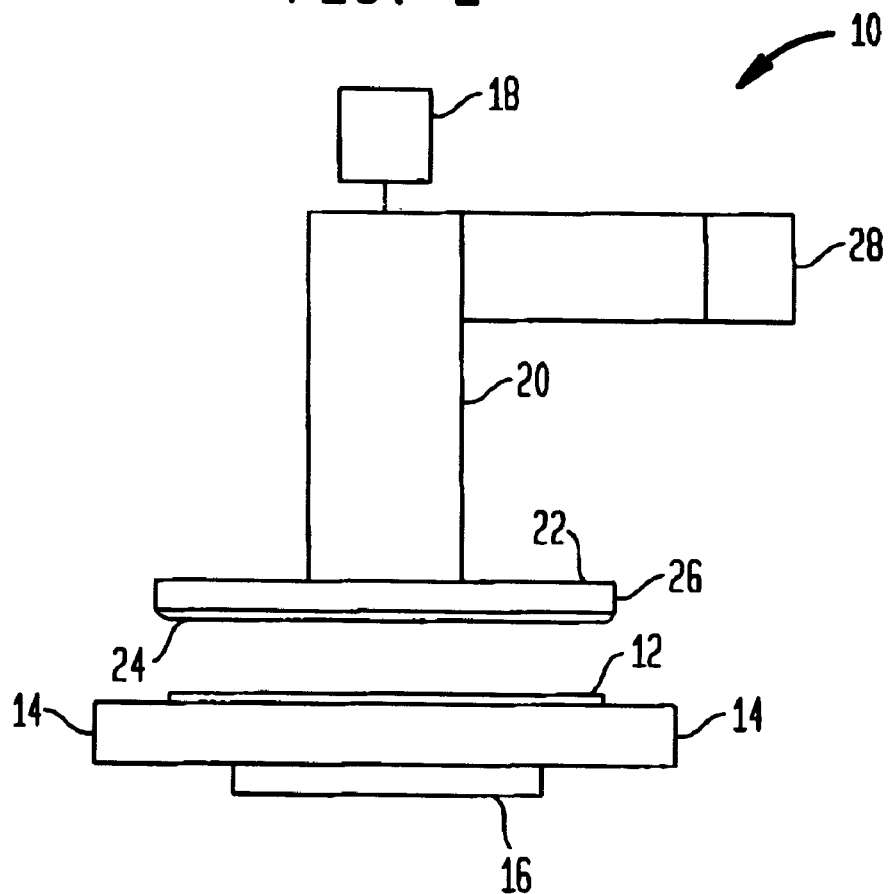
FIG. 1 shows a diagram of an exemplary embodiment of a recycling apparatus used for recycling silicon wafers according to the method of the present invention.

FIG. 1 shows an exemplary embodiment of a recycling apparatus 10 for recycling silicon wafers 12 according to the method of the present invention. Wafer 12 will have been used in the quality assurance testing of IC fabrication equipment. The wafer 12 will typically have one or more films of a semiconductor material deposited on its surface rendering the wafer unusable. As such, the wafer would ordinarily be discarded unless it was recycled.

Figure 2:
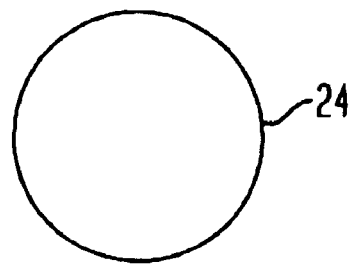
FIG. 2 shows a diagram of a diamond wheel used in the apparatus shown in FIG. 1.

Conventional recycling of wafer 12 is performed using an expensive and time consuming chemical cleaning processes. The recycling apparatus 10 of the present invention employs a significantly faster process that avoids the use of potentially harmful chemicals. The wafer 12 is mounted on a chuck 14 which first conventional motor 16 rotates. A second conventional motor 18 rotates a spindle 20 disposed above the wafer 12. A grinding wheel holder 22 is mounted to the spindle 20. A diamond wheel 24, also shown in FIG. 2, is attached to the grinding wheel holder 22 by means of a holding ring 26. The diamond wheel 24 is preferably about 2.0+/−0.2 mm thick and has an inside diameter (ID) of 158+/−0.1 mm. The height of the grinding wheel holder 22 is 22.5+/−1.0 mm. The assembly of the second conventional motor 18, the spindle 20, the grinding wheel holder 22, the wheel 24, and the holding ring 26 are vertically movable as a unit by means of a translatable mount 28.

In the present invention, two identical recycling apparatus 10 are used with a first recycling apparatus employing a coarse diamond wheel, and the second recycling apparatus employing a fine diamond wheel. Alternatively, a single recycling apparatus 10 can be used with either a coarse or fine diamond wheel installed depending on the desired recycling step. In a preferred embodiment of the present invention, a Model No. DFG840 automated grinder manufactured by the Disco Corporation of Japan is used to recycle wafers which are five to eight inches in diameter. Recycling apparatus 10 can also include a programmable microcontroller to control the duration and speed of grinding by diamond wheel 24.

Figure 3:
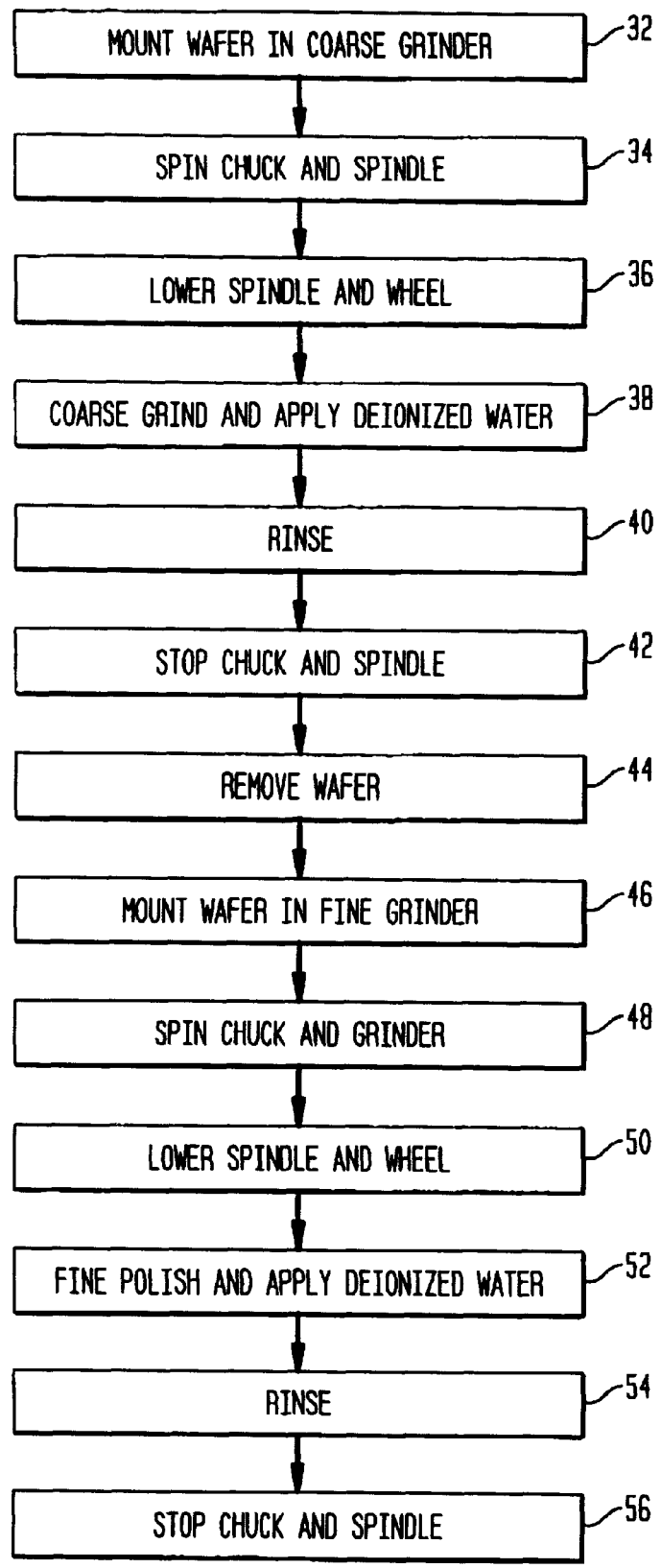
FIG. 3 shows a flow chart of an exemplary embodiment of the method of recycling wafers according to the present invention.

A preferred embodiment of the method of the present invention is shown in flow chart form in FIG. 3. At step 32, a wafer 12 is first mounted face up on the chuck 14 of a recycling apparatus 10 employing a coarse diamond wheel 24. The wafer is secured on the chuck 14 by means of a vacuum. At step 34, first conventional motor 16 rotates wafer 12 and chuck 14 to a speed of 240+/−RPM, while the second conventional motor 18 rotates the spindle 20 with the grinding wheel holder 22 and coarse wheel 24 in the same direction to a speed of 1500+/−RPM.

At step 36, the grinding wheel holder 22 is lowered until the diamond wheel 24 touches the surface of the wafer 12. Once the diamond wheel 24 and the wafer 12 are in contact, then at step 38 grinding begins and simultaneously deionized water is applied in a continuous stream onto the wafer 12 until the grinding process is complete and approximately 50 microns of material have been removed from the wafer 12. The water acts as a lubricant which reduces friction between the wafer 12 and the diamond wheel 24, thereby enabling the grinding to be performed more efficiently than it would otherwise be possible. In addition, the water helps control dust produced by the grinding.

As step 40, the wafer 12 is rinsed, and at step 42 the chuck 14 and the spindle 20 are slowed to a stop. At step 44, the wafer 12 is removed from the coarse grinder, and at step 46 it is mounted in a second recycling apparatus 10 having a fine diamond wheel 24. Previously described steps 34–42 are then repeated using the fine wheel 24 to attain a fine finish as shown in FIG. 3 in corresponding steps 48–56. The coarse grinding at step 38 and the fine grinding at step 52 each remove approximately 25 microns of semiconductor material from the face of wafer 12 for a total removal amount of 50 microns of material. The duration and speed at which the coarse grinding and fine grinding are performed are predetermined by prior tests on similar wafers. In an alternative embodiment, rinse steps 40 and 54 need not be performed.

The entire recycling procedure of the invention can be performed in about 30–40 seconds. This time, which includes ramp up and ramp down time for the first and second conventional motors 16 and 18, is considerably faster than conventional chemical wafer cleaning processes. The silicon wafer 12 is usually about 675 microns thick before being recycled using the grinding method of the present invention and is about 625 microns after the removal of the deposited film and bulk silicon. By limiting the reduction in wafer thickness to 50 microns or less, the reclaimed wafers can be reused as dummy or control monitor wafers in non-critical operations. The method of the present invention can be used to recycle silicon wafers used in the quality assurance testing of photolithography equipment, vapor deposition equipment, liquid phase epitaxy equipment, etc.

In a test of the method of the present invention, 25 wafers were recycled. These wafers had been subjected to the following standard control wafer fabrication deposition process: PETOES (10,000 Angstroms); Ti (250 Angstroms); TiN (500 Angstroms); and CVD-Tungsten (4,000 Angstroms). The wafers were measured before and after tungsten film deposition on a four-point probe. The post deposition measurements of thickness and stress were as follows: Pre-Resistivity (Ohms/sq)=8.4+/−2%; Post-Resistivity (Ohms/sq)=0.258+/−1.1%; Thickness (Angstroms)=4,200+/−1%; and Stress E9 (Dynes/cm2)= 14.5 to 14.7. These results compare favorably with virgin silicon wafers processed using the same method.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claims is reserved.

What is claimed is:

1. A method for recycling a substrate used for fabricating integrated circuits, comprising the steps of:

employing a coarse grinding surface for removing deposited semiconductor material from the face of a used substrate;

employing a fine grinding surface for removing the deposited semiconductor material from the used substrate, wherein the recycled substrate can then be reused for fabricating integrated circuits; and applying water during the steps of coarse grinding and fine grinding to reduce friction during grinding and to control dust produced by the steps of coarse grinding and fine grinding.

2. The method according to claim 1, wherein each one of the coarse and fine grinding surfaces are integral to a separate one of an identical grinding apparatus, each apparatus having a chuck and a grinding wheel, the wafer being mounted on the chuck, relative rotation being induced between the grinding wheel and the chuck, and the grinding wheel rotating at a first speed and the chuck rotating at a second speed that is slower than the first speed.

3. The method according to claim 2, wherein the coarse grinding surface is a diamond wheel.

4. The method according to claim 3, wherein said first speed is +/−1,500 RPM and the second speed is +/−240 RPM.

5. The method according to claim 2, wherein the grinding wheel and the chuck rotate in the same direction.

6. The method according to claim 1, wherein the liquid is deionized water.

7. The method according to claim 1, wherein the steps of coarse grinding and fine grinding are together performed in less than 50 seconds.

8. The method according to claim 1, wherein the steps of coarse grinding and fine grinding together remove up to 50 microns of the deposited semiconductor material from the face of the substrate.

9. A method for recycling a wafer used for quality assurance testing of integrated circuit fabrication equipment, comprising the steps of:

(a) installing a used silicon wafer having semiconductor material deposited on its face in a coarse grinding apparatus having a chuck and a grinding wheel, the used silicon wafer being mounted face up on the chuck;

(b) inducing relative rotation between the chuck and the grinding wheel, wherein the grinding wheel is rotated at a first speed and the chuck is rotated at a second speed that is slower than the fist speed;

(c) decreasing the distance between the used silicon wafer and the grinding wheel until they make contact;

(d) employing the grinding wheel to grind the silicon until a predetermined thickness of the deposited semiconductor material has been removed from the used silicon wafer while simultaneously applying a liquid to reduce friction and control dust produced by the coarse grinding;

(f) rinsing the used silicon wafer with the liquid to remove dust produced by the coarse grinding process;

(g) installing the used silicon wafer in a fine grinding apparatus having a chuck and a grinding wheel, the used silicon wafer being mounted face up on the chuck; and (h) repeating steps b–f with the wafer installed in the fine grinding apparatus, wherein the recycled wafer can then be reused for quality assurance testing of integrated circuit fabrication equipment.

10. The method according to claim 1, wherein the grinding wheel and the chuck rotate in the same direction.

11. The method according to claim 10, wherein the grinding wheel and the chuck rotate in the same direction.

12. The method according to claim 10, wherein the first speed is +/−1500 RPM and the second speed is +/−240 RPM.

13. The method according to claim 10, wherein the liquid is deionized water.

14. The method according to claim 10, wherein the steps (a)–(h) are together performed in less than 50 seconds.

15. The method according to claim 10, wherein the steps of coarse grinding and fine grinding together remove up to 50 microns of the deposited semiconductor material from the face of the used silicon wafer.

16. The method according to claim 10, wherein the steps of coarse grinding and fine grinding together grind the wafer to a thickness of 625 microns.

17. The method according to claim 10, wherein the coarse grinding surface is a first diamond wheel.

18. The method according to claim 10, wherein the fine grinding surface is a second diamond wheel.

19. The method according to claim 10, wherein the recycled wafers are used to calibrate and maintain photolithography equipment.

20. The method according to claim 19, wherein the photolithography equipment is used to fabricated integrated circuits.

21. The method according to claim 10, wherein the recycled wafers are used to calibrate and maintain liquid phase epitaxy equipment.

22. The method according to claim 21, wherein the liquid phase epitaxy equipment is used to fabricated integrated circuits.

23. The method according to claim 10, wherein the recycled wafers are used to calibrate and maintain vapor deposition equipment.

24. The method according to claim 23, wherein the vapor deposition equipment is used to fabricated integrated circuits.

* * * * *